(12) United States Patent
Schwoerer et al.

(10) Patent No.: US 8,054,915 B2
(45) Date of Patent: Nov. 8, 2011

(54) METHOD AND DEVICE FOR ADJUSTING A PULSE DETECTION THRESHOLD, AND PULSE DETECTION AND CORRESPONDING RECEIVER

(75) Inventors: Jean Schwoerer, Grenoble (FR); Benoît Miscopein, Grenoble (FR)

(73) Assignee: France Telecom, Paris (FR)

( * ) Notice: Subject to any disclaimer, the term of this patent is extended or adjusted under 35 U.S.C. 154(b) by 716 days.

(21) Appl. No.: 12/087,156

(22) PCT Filed: Dec. 22, 2006

(86) PCT No.: PCT/FR2006/002866
§ 371 (c)(1),
(2), (4) Date: Jun. 27, 2008

(87) PCT Pub. No.: WO2007/074237
PCT Pub. Date: Jul. 5, 2007

(65) Prior Publication Data
US 2009/0033399 A1 Feb. 5, 2009

(30) Foreign Application Priority Data
Dec. 28, 2005 (FR) ..................................... 05 13421

(51) Int. Cl.
*H04L 25/03* (2006.01)

(52) U.S. Cl. ........ 375/317; 375/316; 375/340; 375/341; 329/312; 329/313; 329/341; 340/870.23; 340/870.21; 327/18; 327/26; 327/37

(58) Field of Classification Search .................. 329/312, 329/313, 341; 340/870.23, 870.21; 327/18, 327/26, 31, 36, 544; 370/212, 213, 505; 714/709, 812; 375/316, 360, 358, 340, 341; 342/93, 91
See application file for complete search history.

(56) References Cited

U.S. PATENT DOCUMENTS

| 3,983,422 | A | | 9/1976 | Nicolson et al. | |
|---|---|---|---|---|---|
| 4,176,337 | A | * | 11/1979 | Aechter et al. | 367/138 |
| 5,337,054 | A | * | 8/1994 | Ross et al. | 342/93 |
| 5,901,172 | A | * | 5/1999 | Fontana et al. | 375/130 |
| 6,967,993 | B1 | | 11/2005 | Miller | |
| 7,817,762 | B2 | * | 10/2010 | Johnstone et al. | 375/360 |

* cited by examiner

*Primary Examiner* — Khanh C Tran
*Assistant Examiner* — Rahel Guarino
(74) *Attorney, Agent, or Firm* — McKenna Long & Aldridge LLP

(57) ABSTRACT

The invention relates to a method for adjusting a pulse detection threshold consisting in detecting a pulse when the edge of said pulse envelop crosses the threshold, in allocating (A) a staring value ($TH_0$) to the threshold and in adjusting ($B_1$) the threshold (TH) in such a way that the number of pulses detected on at least one observation window ($OW_j$) satisfies a predetermined criterion in a determined time.

13 Claims, 3 Drawing Sheets

METHOD AND DEVICE FOR ADJUSTING A PULSE DETECTION THRESHOLD, AND PULSE DETECTION AND CORRESPONDING RECEIVER

This application claims priority from PCT/FR2006/002866 filed Dec. 22, 2006, which claims priority from French Application FR 05 13421, filed Dec. 28, 2005, both of which are hereby incorporated by reference in their entirety.

The invention relates to a method and a device for adjusting a pulse detection threshold. The invention relates furthermore to a method and a device for detecting pulses using the threshold thus adjusted, in particular for a pulse radio ultra wideband receiver, and a corresponding receiver.

The emergent technique of pulse transmission, in particular radio, uses the sending of the information to be transmitted by means of pulses and implements in particular ultra wideband receivers, designated UWB receivers for Ultra Wide Band.

Thus a pulse signal is not a continuous signal, but a train of brief pulses of low duty ratio.

As regards the modulation of this signal, the commonest modes are PPM for Pulse Position Modulation, the pulse being shifted or not shifted in time, according to the value of the symbol, discrete amplitude modulation (or OOK for On-Off Keying), the pulse being sent or not sent according to the value of the symbol, binary phase shift modulation (or BPSK for Binary Phase Shift Keying), the polarity of the pulse being reversed or not reversed, according to the value of the symbol.

During the synchronization acquisition phase, by exploiting the a priori knowledge of a sequence, the receiver identifies this sequence, positions its start in time and extracts therefrom the sought-after time reference.

UWB reception technology is recent. Current UWB receivers rely on a principle of pulse detection by synchronous correlation.

In the aforesaid receivers, it is the correlation rate obtained which is compared with a threshold value for decision taking. In this case, proper adjustment of the value of this threshold is less critical, since this value represents a confidence or likelihood rate and not an instant of arrival of a pulse.

However, the principle of detecting a pulse in a noisy signal is very old and goes back to that of RADAR.

Numerous theoretical developments have been proposed while studying this principle.

By way of example, the principle of detection with constant false alarm rate, CFAR, is recalled. The aforesaid principle consists in determining the maximum number of triggerings by noise spikes (false alarm) that the system can tolerate, while satisfying the expected performance. The aforesaid system, in the presence of noise only, executes a calibration phase during which, by dichotomy, it triggers the threshold value corresponding to this maximum number of false alarms. The threshold value thus obtained corresponds to the best possible sensitivity for a fixed error rate.

Only the process of the CFAR detector is worthy of promise, but it exhibits certain drawbacks, directly related to the principle thereof:

it sets a floor examination rate: the receiver positions its threshold to obtain the number of false alarms, and therefore of errors, whatever the conditions of transmission. Therefore, the receiver is incapable of utilizing very good conditions, even if the latter turn out to be of such a nature as to permit much better performance;

false alarms represent the large majority of errors, this imbalance having to be compensated for by the coding system;

calibration of the threshold is complex since, in contradistinction to a radar, the receiver does not control the sending of the signal intended for it. It is therefore necessary to disconnect the receiver's antenna so as to be sure of the absence of any signal during its calibration. The calibration process can therefore be executed only rarely and outside of any dynamic communication phase. Adaptive calibration during operation is not conceivable, hence the receiver cannot evolve as a function of the variability of the channel.

It is also possible to seek a fixed number of triggerings per symbol time on the useful signal. The number of triggerings corresponds to the number of pulses the rising edge of whose envelope crosses a threshold. This principle is the simplest, but it relies on the knowledge of the number of pulses transmitted per time interval. The threshold value is then lowered by a value $\Delta$ at each iteration, until it allows the detection of the expected number of pulses. Thus, if the synchronization header comprises eight pulses per symbol time, the object of the system will be to obtain eight triggerings per symbol time.

This technique of positioning the threshold as a function of the number of triggerings per symbol time poses the problems according to which:

just like for the CFAR technique, the fact that the receiver cannot evolve as a function of the variability of the channel; and, furthermore, poor positioning of the threshold, when the synchronization header is swamped in noise, since certain noise spikes of greater amplitude than the pulses are then regarded as detected pulses, thus giving rise to a high rate of errors due to non-detection.

Ultimately, the prior art techniques seek to minimize an error rate of a precise type, either the non-detection rate in the case of detection by correlation, or the false alarm rate in the case of CFAR and iterative positioning on the synchronization header, to the detriment of errors of another type, respectively either the false alarm rate, or the non-detection rate.

SUMMARY OF THE INVENTION

The object of the present invention is to propose a technique that seeks a balance between the two types of errors which minimizes, at one and the same time, the rates of errors due to non-detection and the rates of errors due to false alarms.

With this aim, the invention proposes adjusting the positioning of the pulse detection threshold as a function of the number of triggerings, not over the symbol time but over at least one predetermined observation window in a symbol time.

According to another aspect, the observation window is positioned so as to observe at least one pulse. Thus, by isolating the pulses in the noise, by virtue of the observation windows, the threshold is more often adjusted with respect to a pulse and not with respect to a noise spike.

This makes it possible to reduce at one and the same time the false alarm error rate related to noise spike detection instead of pulse detection and the non-detection rate related to too high a positioning of the threshold, in the case of pulses swamped in noise.

The method for adjusting a pulse detection threshold, a pulse being detected when one of the edges of the envelope of this pulse crosses this threshold, which is the subject of the invention, is noteworthy in that it consists at least in allocating this threshold an initial value and adjusting this threshold so long as the number of pulses detected over at least one observation window in a determined time does not satisfy a predetermined criterion.

According to characteristics, the adjustment is performed by variation of the value of the threshold, so long as the number of pulses detected over at least one observation window in a determined time satisfies the predetermined criterion, this adjustment being performed by iteration in a first direction, until the value of this threshold has attained a first bound, and in a second direction, if the value of this threshold has attained this first bound.

Two-way or two-direction evolution makes it possible to reduce the non-detection of the pulses.

According to other characteristics, the adjustment is performed in the first direction and the second direction in relation to a first and a second bound, respectively, the threshold value on attainment of one of the first or second bounds being adjusted by variation in the opposite direction with a different mode of variation.

The limits imposed by these bounds make it possible to prevent entry into an endless loop.

By implementing the aforesaid characteristics, it is understood that the dynamic adaptation or adjustment of the threshold thus takes place via a double feedback loop insofar as the feedback loops consist of substantially independent incrementation and decrementation loops, respectively, in which the threshold value is modified if the number of pulses detected in the observation window or the successive observation windows does not comply with the number of triggerings expected. By changing function and feedback loop, it is possible to prevent the thresholds retaking already tested values.

According to other characteristics, the number of iterations is equal to a predetermined number. This makes it possible to avoid endless loops.

According to other characteristics, the adjustment until satisfaction of the criterion is renewed over at least one following determined time.

According to other characteristics, the predetermined criterion comprises a test of the number of pulses detected with respect to a value equal to the number of pulses detectable per determined time or with respect to an interval about a value equal to the number of pulses detectable per determined time.

According to other characteristics, the observation window makes it possible to extract at least one part of the pulse with respect to which it is positioned, which part is sufficient to detect the pulse. This reduction of the window makes it possible to further reduce the noise.

The invention also covers a method for detecting pulses, a pulse being detected when one of the edges of the envelope of this pulse crosses this threshold, this method for detecting pulses being noteworthy in that it consists in adjusting the threshold, according to the aforesaid method which is the subject of the invention.

The invention also covers a device for adjusting a pulse detection threshold, a pulse being detected when one of the edges of the envelope of this pulse crosses the threshold, this device being noteworthy in that it comprises at least means for allocating an initial value to the threshold and means for adjusting the thresholds so long as the number of pulses detected over at least one observation window in a determined time does not satisfy a predetermined criterion.

The invention furthermore covers a device for detecting pulses, which is noteworthy in that it comprises an aforesaid device for adjusting the pulse detection threshold.

The ultra wideband receiver of a pulse radio signal, which is the subject of the invention, this signal including pulses over each successive symbol time, is noteworthy in that it comprises at least one unit for extracting the envelope of these pulses, this extraction unit delivering envelope signals, a detection module comparing the envelope signals with an adjustable threshold value delivering detected pulses and a module for calculating and adjusting the threshold value as a function of the number of pulses detected over at least one observation window.

The method, the device for detecting pulses and the receiver which are the subjects of the present invention find application to ultra wideband radiocommunication, in particular for the implementation of local or domestic receivers.

They will be better understood on reading the description and observing the drawings hereinafter in which:

BREIF DESCRIPTION OF THE DRAWING

DESCRIPTION OF PREFERRED EMBODIMENTS

Figure 1A:
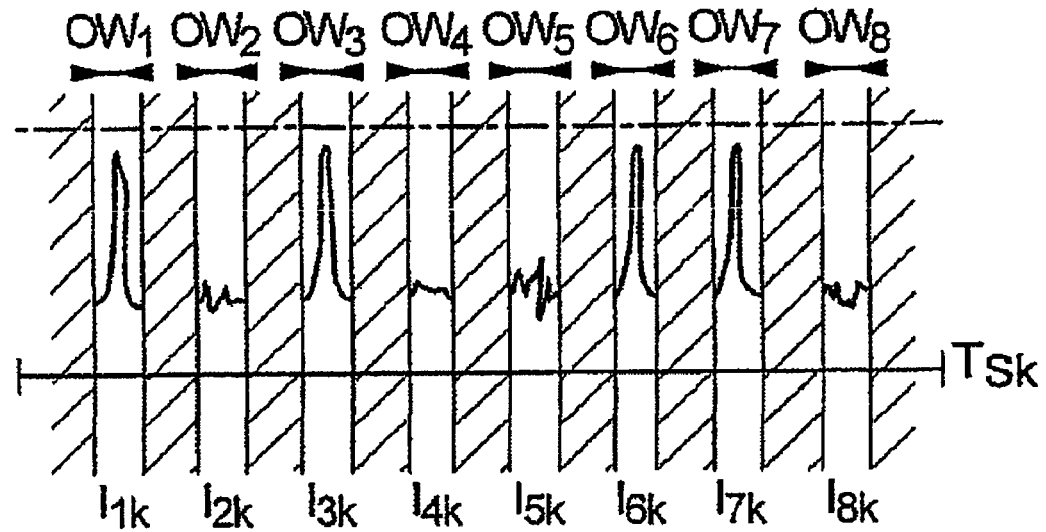
FIG. 1A represents, by way of illustration, a flowchart of the essential steps for implementing the general method which is the subject of the present invention.
Figure 1A:
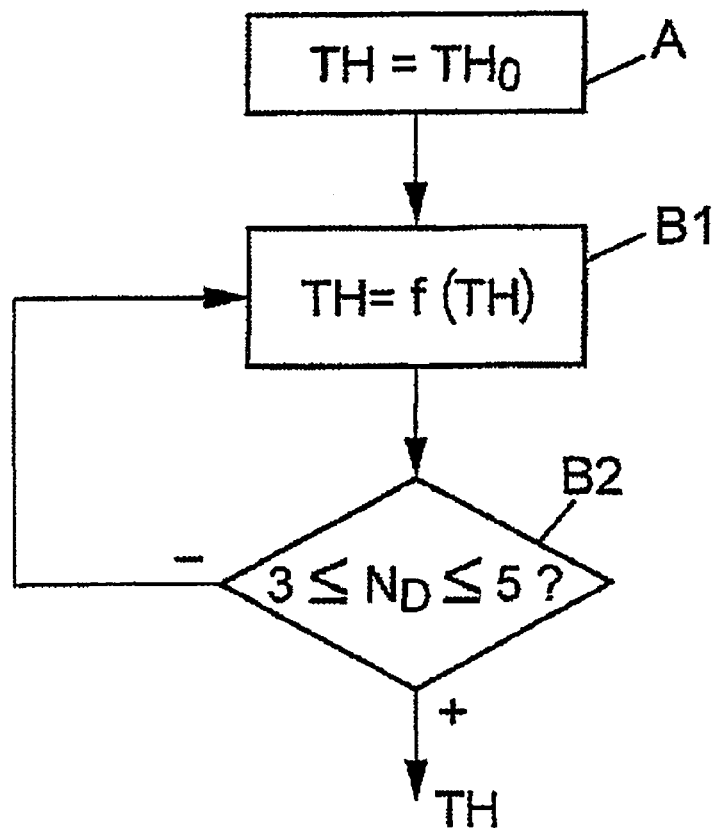

FIG. 1A represents a flowchart of the general method which is the subject of the invention.

The example corresponds to the sending of 8 pulses $I_{jk}$ by OOK modulation in a symbol time $Ts_k$. In order as far as possible to reduce the incidence of noise, an observation window $OW_j$, $OW_1$ to $OW_8$ in FIG. 1A, is positioned with respect to each pulse. It is also conceivable to include several pulses per observation window, but the noise is thus reduced less.

The synchronization is performed beforehand so as to allow the positioning of the observation windows with respect to the pulses. The width of the observation windows is reduced so as to further minimize the impact of the noise on the error rates while taking care to keep them wide enough to allow detection of the pulse. The threshold TH (illustrated by the chain-dotted line) can be that $TH_0$ obtained during the useful synchronization for positioning the observation windows with respect to the pulses. This initial value $TH_0$ is allocated to the threshold TH.

Figure 1B:
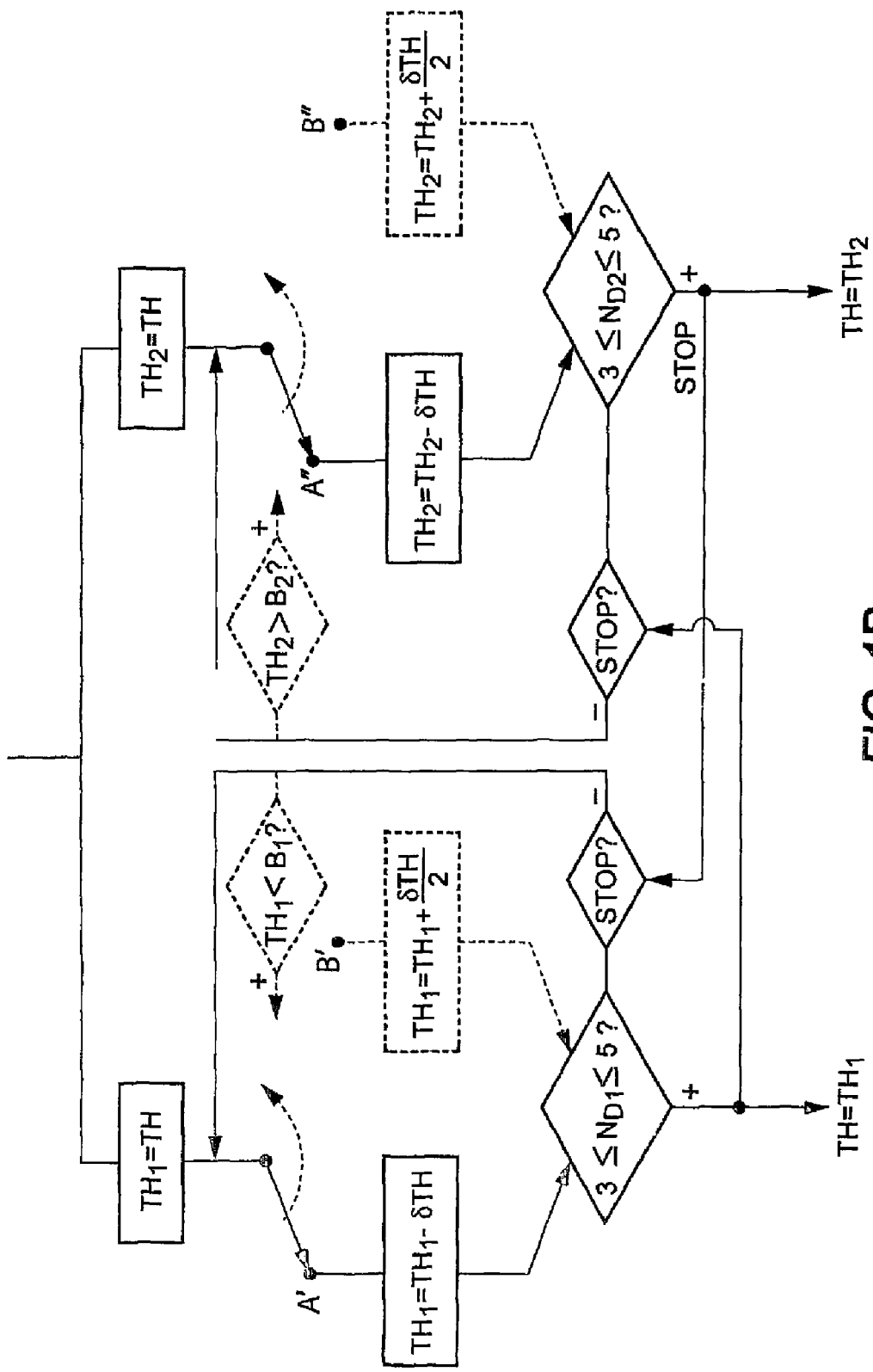
FIG. 1B represents, by way of illustration, a flowchart of an exemplary implementation of the method which is the subject of the invention, such as represented in FIG. 1A.

In the example, the criterion that the number of pulses detected $N_D$ must satisfy is in the example to lie between 3 and 5. This criterion is dependent on the type of sending modulation used and the number of pulses sent per determined time. The determined time is the symbol time. So long as this criterion is not satisfied, the threshold is adjusted with the aid of a function f( ) which can be a simple function for decrementing or incrementing the threshold TH by a variation stepsize $\delta TH$ or a double function allowing the threshold to be adjusted in two directions of variation simultaneously, as illustrated in FIG. 1B. The threshold TH which makes it possible to satisfy this criterion is that used by the pulse detector.

According to a first variant of the invention, not illustrated in the drawings, the adjustment of the threshold comprises an adjustment in a first direction $f_{d1}( )$. At each iteration, i.e. at each adjustment of the threshold, the threshold TH is tested with respect to a limit B1. As soon as the threshold TH crosses this limit B1, the adjustment is performed in a second direction $f_{d2}( )$.

FIG. 1B shows other variants of the method with a certain number of optional steps, represented dashed, in the same example, i.e.: 8 pulses per OOK modulation in a symbol time, with an observation window positioned with respect to each pulse.

In a second variant, the threshold TH then enters a double feedback loop. In the first branch, the threshold TH, then named $TH_1$, is adjusted in a first direction with the aid of a function $f_{d1}( )$ which can be a simple decrementation function $TH_1 - \delta TH$ as illustrated in FIG. 1B. Each of these two loops is iterated, the two thresholds $TH_1$ and $TH_2$ being adjusted, so long as the criterion, the same criterion as in the previous example, is not satisfied by one of the two thresholds obtained $TH_1$ or $TH_2$.

The two-way evolution, either successively as in the variant not represented in the drawing, or simultaneously as in the variant represented in FIG. 1B, reduces the non-detection of the pulses. Specifically, adjusting the threshold in a single direction reduces the non-detection only if this direction corresponds to the direction in which the signal evolves. Now, for example, in the case where the initial value of the threshold TH is less than the amplitude minimum of the signal while the threshold adjustment is performed by decrementation, the adjusted threshold will never make it possible to satisfy the criterion.

In a third variant of the method of the invention indicated dashed in FIG. 1B, two limits $B_1$ and $B_2$ are fixed respectively in the first and second directions. These limits make it possible to prevent entry into an endless loop.

Thus, in the example illustrated in FIG. 1B, the first direction corresponding to decrementation, as soon as the threshold $TH_1$ crosses the limit $B_1$, in the example $TH_1 < B_1$, the adjustment of the threshold $TH_1$ is no longer done in the first direction but in the second direction according to another function $f_{d2}'( )$ which, in the example illustrated, is an incrementation according to a stepsize $\delta TH/2$. In the same manner, as soon as the threshold $TH_2$ crosses the limit $B_2$, in the example $TH_2 < B_2$ since the second direction corresponds to incrementation, the adjustment of the threshold $TH_2$ is no longer done in the second direction but in the first direction according to another function $f_{di}'( )$ which, in the example illustrated, is a decrementation according to a stepsize $\delta TH/2$. By changing function, it is possible to prevent the thresholds $TH_1$ and $TH_2$ retaking already tested values.

The criterion may be either that the number of pulses detected is equal to the exact number of pulses detectable per symbol time with the modulation used, in the example 4 with OOK modulation, or that the number of pulses detected is in a given interval about this number of detectable pulses, in the example with OOK modulation, in particular between 3 and 5. This tolerance makes it possible to reduce the risk of an endless loop.

Still with the same aim of avoiding endless loops, the number of threshold adjustment iterations may be fixed. The part extracted by the observation window for the pulse with respect to which it is positioned is sufficient to detect the pulse. For example, the observation window in the case of OOK modulation can correspond to half the pulse, in particular just to the rising edge of the pulse. This reduction of the window makes it possible to further reduce the noise.

In a fifth variant, the adjustment until satisfaction of the criterion is renewed over at least one following symbol time. This renders the process adaptive and makes it possible to follow the variations of the channel. According to the speed of variation of the channel, the renewal of the adjustment can be envisaged every N symbol times, N=1 for a fast variation channel, and N being all the further from 1 the slower the speed of variation of the channel.

In a sixth variant of the invention, the observation windows make it possible to observe the pulse partially.

According to the type of modulation used, in particular in the case of modulation of the OOK or PPM type, a variant of the detection method which is the subject of the invention is based on the knowledge of the number of reception windows having to contain a pulse and the number of windows having to contain an absence of pulse. The invention then relies on searching for a threshold which satisfies these two criteria, number of presence and of absence of pulse.

The method which is the subject of the invention thus makes it possible to define a new procedure for positioning a detection threshold TH for a pulse detection device or a pulse radio UWB receiver and the corresponding pulse detection method.

Its object is no longer to seek a threshold value which minimizes a type of error, that is to say the absence of detection to the detriment of a detection in relation to a threshold value, such as a threshold representative of false alarm. On the contrary, the method which is the subject of the invention makes it possible, through the operative mode described in conjunction with FIG. 1A, to keep the threshold value TH at an intermediate value between a maximum value representative of a false alarm rate for example, and a minimum value minimizing the absence of detection.

In a more specific example of an energy-detection receiver and a radio signal in which the symbols consist of N chips modulated in OOK mode, each chip is a pulse which is or is not sent according to the value of the chip.

For each symbol, the number of chips of value 1 is equal to the number of chips of value 0.

As regards the step of detection with respect to the threshold value TH, it is indicated that the corresponding processing begins with a rectification and a filtering of the radiofrequency signal RF, so as to obtain the envelope of the latter.

Processes which make it possible to obtain the envelope of a radiofrequency signal are known as such and, for this reason, will not be described in detail.

The envelope signals obtained are then subjected to a threshold detection in relation to the threshold value TH.

The object of this detection in relation to the aforesaid threshold value is to return a rising edge for each pulse whose envelope, that is to say ultimately whose amplitude, exceeds the fixed detection threshold value.

The method which is the subject of the fifth variant of the invention constitutes an adaptive procedure, which can be conducted throughout the duration of the communication and thus enables the pre-established threshold value TH to be made to evolve best.

A threshold value pre-established during manufacture, that is to say when making the receiver which is the subject of the invention, which will be described in a more detailed manner subsequently in the description, the value $TH_0$ previously cited or, if appropriate, a threshold value established according to the principle of the constant false alarm rate CFAR, for example, then makes it possible to fulfil the jobs of detecting start of frame and acquiring synchronization.

It is recalled that, when the detection is synchronized, the patterns effected by the direct and secondary pulses are repetitive over each duration of the hop sequence.

The method which is the subject of the invention is therefore then particularly advantageous, insofar as the observation windows $OW_j$ can then be placed in reception as a function of the hop code and of the synchronization.

The receiver which is the subject of the invention can then advantageously be configured so as to be listening for the envelope signals only in the aforesaid observation windows.

As regards the observation windows $OW_j$, it is indicated that each window can be a time window of smaller duration than the symbol time $T_s$ or, preferably, a symbol time fraction.

Additionally, during the actual communication phase, half the chips are in the 1 state and the other in the 0 state, whatever binary symbol is transmitted.

It is therefore possible to envisage a feedback process based on a criterion of detecting a pulse in only 50% of the observation windows for one and the same symbol.

The method of ultra wideband non-coherent adaptive detection of a pulse radio signal, which is the subject of a variant of the invention, and the corresponding receiver now take into consideration only what happens in the observation windows.

Furthermore, the positioning of the threshold is no longer not influenced by anything outside of the observation windows $OW_j$.

The detection process and the corresponding receiver, in accordance with the subject of the present invention, are then less sensitive to noise spikes and to interference from other users, which statistically only rarely fall in the aforesaid observation windows.

For each symbol time, for example, the threshold can be dynamically adjusted, so as to have triggering on half the listening time.

In a preferential nonlimiting mode of implementation, the number of triggerings $N_D$ can be chosen equal to a value lying between 3 and 5, as illustrated in FIG. 1B.

Finally, the method which is the subject of the invention can also consist in adding a limit value to the number of iterations performed, so as to avoid an endless looping effect, which can occur in certain particular cases.

The method which is the subject of the invention thus makes it possible to position the decision threshold value for detecting the pulses with the aid of a double-loop iterative process, while keeping the balance of detection of the two assumptions as criterion and by considering only the precise moments of interest, in contradistinction to the prior art methods, which consider only one assumption and the entire time.

The method which is the subject of the invention thus allows great flexibility of use, because of the adaptive nature of the process as a whole.

A more detailed description of an ultra wideband receiver of a pulse radio signal, in accordance with the subject of the present invention, will now be given in conjunction with FIG. 2A.

The receiver which is the subject of the invention receives the ultra wideband radio signal, which includes pulses over each successive symbol time.

Figure 2A:
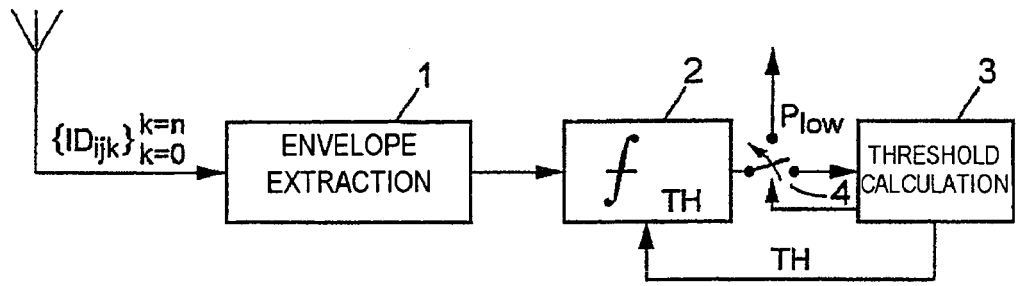
FIG. 2A represents, by way of illustration, a functional diagram of a device for detecting pulses and of an ultra wideband receiver in accordance with the subject of the present invention.

As represented in FIG. 2A, it comprises, in addition to a reception antenna RA, pulses $\{ID_{ijk}\}_{k=0}^{k=n}$, a unit 1 for extracting the envelope of the aforesaid pulses.

As previously mentioned, the envelope extraction can be executed by any rectification circuit known from the prior art and, for this reason, will not be described in detail. The envelope extraction unit delivers envelope signals.

The receiver which is the subject of the invention comprises, furthermore, a module 2 for detecting pulses comparing the envelope signals with an adjustable threshold value, the value TH previously mentioned in the description. The detection module 2 delivers, on the basis of the envelope signals, detected pulses denoted $P_{low}$.

Finally, the receiver which is the subject of the invention comprises a module 3 for calculating and adjusting the threshold value TH as a function of the number of pulses detected over the observation windows OW, the calculation and adjustment module 3 operating on the basis of the detected pulses $P_{low}$. When the threshold TH is adjusted, the module 3 for calculating and adjusting the threshold value TH authorizes the use of the pulses detected by comparing the envelope with this threshold value TH adjusted by the remainder of the processing chain with the aid of the switch 4. To allow the processing of the whole of the signal received, the output of the envelope extraction module 1 is advantageously detained for the threshold value adjustment time.

It will be noted here that the invention also relates to a device for detecting pulses comprising the module 2 for detecting pulses and the threshold calculation and adjustment module 3.

In a variant of the invention, the adjustment of the threshold will be done in tandem with the processing of the signal received. Thus, the module 2 for detecting the pulses will not wait for the adjustment of the threshold in order to provide the pulses detected to the remainder of the processing chain. Consequently, it will not be necessary to detain the envelope signal.

In a more specific manner, it is indicated that the calculation module 3 advantageously comprises a first adjustment operator 34 using a first resource 36, for example a resource for decrementing the threshold value TH by a decrementation value $\delta TH$. The aforesaid decrementation resource can consist of a subtraction module for executing the mode of implementation of the left branch of FIG. 1B.

Likewise, the calculation module 3 comprises a second adjustment operator 35 using a second resource 37, for example a resource for incrementing the threshold value TH by an incrementation value $\delta TH$. The aforesaid incrementation resource can consist of an addition resource for executing the mode of implementation of the right branch of FIG. 1B.

Figure 2B:
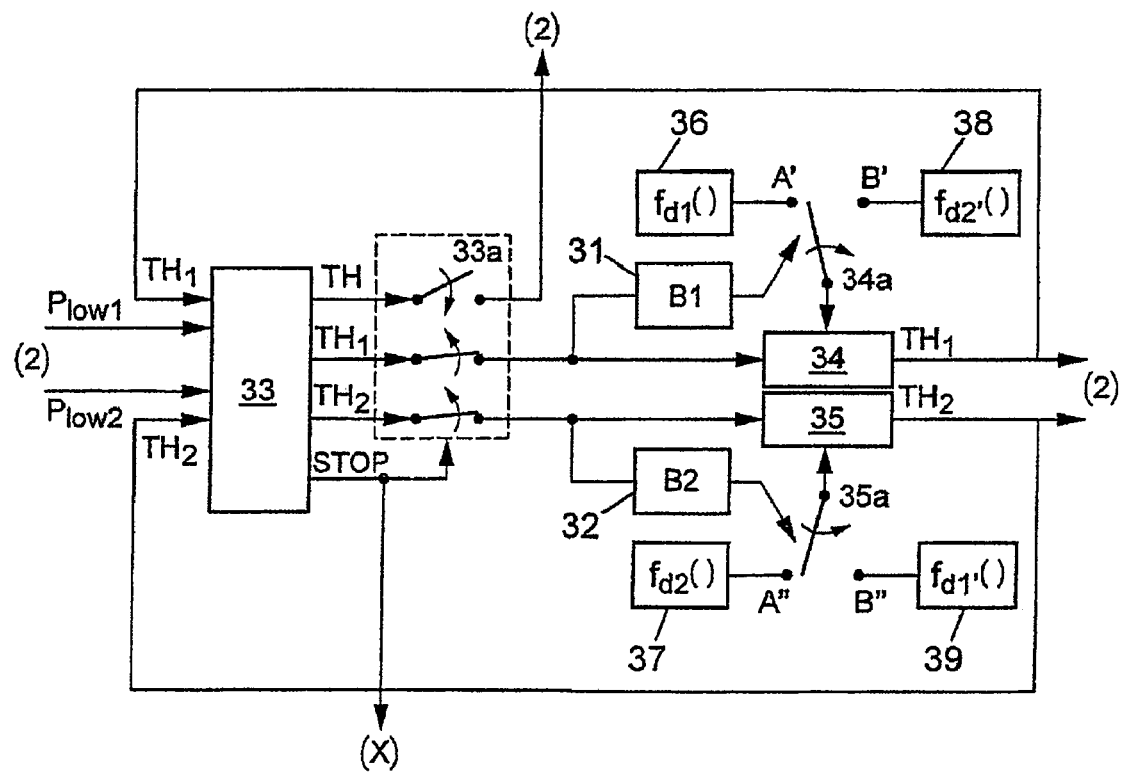
FIG. 2B represents, by way of illustration, a functional logic diagram for implementing a module for calculating the threshold value, incorporated into a receiver, such as represented in FIG. 2A.

Finally, the calculation module 3 can furthermore comprise switches 34a and 35a of the first and second decrementation respectively incrementation resources 36, 37. Other second resources 39, for example decrementation resources, can then be substituted for the incrementation resources 37 on attainment of a limit, for example a maximum value, the value B2 by the threshold value, and other first resources, for example incrementation resources 38, can then be substituted for the decrementation resources 36 on attainment of a limit, for example a minimum value, the value B1 by the threshold value TH. In FIG. 2B are represented, on the one hand, the first resources 36 and 38 in the form respectively of functions in a first and a second direction $f_{d1}(\ )$ and $f_{d'2}(\ )$, respectively the second resources 37 and 38 in the form respectively of functions in a second and a first direction $f_{d2}(\ )$ and $f_{d'1}(\ )$. The blocks 31 and 32 represent the stored values of the limit values B1 and B2.

The switches bear the reference 33, 33a, 34a, and 35a.

The module 33 receives the current values of the threshold $TH_1$ and $TH_2$ provided by respectively the first and second adjustment operator 34 and 35, and the detected pulses $P_{low1}$ and $P_{low2}$ by the module 2 for detecting pulses with respect to these respective threshold values $TH_1$ and $TH_2$. So long as the number of pulses detected either in $P_{low1}$ or in $P_{low2}$ does not satisfy a predetermined criterion, the module 33 retransmits the thresholds $TH_1$ and $TH_2$ and the switch 33a provides these threshold values respectively to the first and second adjustment operators 34 and 35 for a new iteration. As soon as the number of pulses detected either in $P_{low1}$ or in $P_{low2}$ satisfies the predetermined criterion, the module 33 delivers a threshold value TH equal to that of the threshold values $TH_1$, $TH_2$, which made it possible to satisfy this criterion and orders the switch 33a to stop threshold adjustment. The switch 33a then halts the transmission of the threshold values $TH_1$ and $TH_2$ to the first and second adjustment operators 34 and 35, authorizes the delivery of the threshold value TH to the module 2 for detecting pulses, and delivers an order to the switch 4 to allow the use of the pulses detected by the remainder of the processing chain. This current value of the threshold value TH is, of course, dependent on the switching of the switches 33, 33a, 34a, and 35a, in accordance with the operative mode of FIG. 1B.

Having regard to the switching positions of the aforesaid switches, the threshold values $TH_1$ and $TH_2$, current at each iteration, are equal, in the example, either respectively to the decremented value $TH_1-\delta TH$ and to the incremented value $TH_2+\delta TH$, or respectively to the incremented value $TH_1+\delta TH/2$ and to the value $TH_2+\delta TH/2$, as described in conjunction with FIG. 1B.

The invention also covers a computer program product recorded on a storage medium or by an ultra wideband receiver, noteworthy in that it comprises a series of instructions, which during their execution allow the implementation of the method of threshold adjustment and pulse detection, in particular ultra wideband pulse detection, of a pulse radio signal, as previously described in conjunction with FIGS. 1A and 1B.

Furthermore, the computer program product, which is the subject of the invention, is noteworthy in that this program product is installed in a calculation unit of a threshold adjustment device and/or of an ultra wideband receiver, such as described in conjunction with FIGS. 2A and 2B.

The method and the receiver, which are the subjects of the invention, allow the implementation of the advantages below:
- a manifest gain in terms of performance under difficult link conditions, that is to say under link conditions with low signal-to-noise ratio;
- the disappearance of the error rate floor which characterizes the approach to threshold detection with false alarm rate, which characterizes the approach to threshold detection with constant false alarm rate CFAR.

In particular, the receiver which is the subject of the invention is able to profit from a very good signal-to-noise ratio to improve its performance.

Finally, the method, the detection device and the receiver, which are the subjects of the invention, make it possible to restore the balance between the two types of errors, absence of detection and constant false alarm rate.

The invention claimed is:

1. A method for adjusting a pulse detection threshold in a pulse detection device or in a pulse radio ultra wideband receiver, a pulse being detected when one of the edges of the envelope of said pulse crosses said threshold, which said method consists at least in:
   allocating said threshold an initial value;
   adjusting said threshold, by variation of the value of said threshold, so long as the number of pulses detected over at least one observation window in a symbol time does not satisfy a predetermined criterion depending on a number of pulses detectable per symbol time,
   said adjustment being performed by iteration:
   in a first direction corresponding to either an incrementation or a decrementation of the threshold, until the value of said threshold has attained a first bound;
   in a second direction corresponding to either an incrementation or a decrementation of the threshold, said second direction being different from the first direction, if the value of said threshold has attained said first bound.

2. The method as claimed in claim 1, in which the adjustment is performed in the first direction and the second direction in relation to a first and a second bound, respectively, the threshold value on attainment of one of said first or second bounds being adjusted by variation in the opposite direction with a different mode of variation.

3. The method as claimed in claim 1, in which the number of iterations is a predetermined number.

4. The method as claimed in claim 1, in which the adjustment until satisfaction of the criterion is renewed over at least one following symbol time.

5. The method as claimed in claim 1, in which said predetermined criterion comprises a test of the number of pulses detected with respect to a value equal to the number of pulses detectable per symbol time or with respect to an interval about a value equal to the number of pulses detectable per symbol time.

6. The method as claimed in claim 1, in which the observation window makes it possible to extract at least one part of the pulse with respect to which it is positioned, which part is sufficient to detect the pulse.

7. A method for detecting pulses in a pulse detection device or in a pulse radio ultra wideband receiver, a pulse being detected when one of the edges of the envelope of said pulse crosses a threshold, method comprising an adjustment of said threshold, by variation of the value of said threshold, so long as the number of pulses detected over at least one observation window in a symbol time does not satisfy a predetermined criterion depending on a number of pulses detectable per symbol time, said adjustment being performed by iteration:
   in a first direction corresponding to either an incrementation or a decrementation of the threshold, until the value of said threshold has attained a first bound;
   in a second direction corresponding to either an incrementation or a decrementation of the threshold, said second direction being different from the first direction, if the value of said threshold has attained said first bound.

8. A device for adjusting a pulse detection threshold, a pulse being detected when one of the edges of the envelope of said pulse crosses said threshold, this device comprising at least:
   means for allocating an initial value to said threshold;
   means for adjusting said threshold, by variation of the value of said threshold, so long as the number of pulses detected over at least one observation window in a symbol time does not satisfy a predetermined criterion depending on a number of pulses detectable per symbol time, said adjustment being performed by iteration:
   in a first direction corresponding to either an incrementation or a decrementation of the threshold, until the value of said threshold has attained a first bound;
   in a second direction corresponding to either an incrementation or a decrementation of the threshold, said second direction being different from the first direction, if the value of said threshold has attained said first bound.

9. A device for detecting pulses, comprising;
   means for allocating an initial value to a threshold;
   means for adjusting said threshold, by variation of the value of said threshold, so long as the number of pulses detected over at least one observation window in a symbol time does not satisfy a predetermined criterion depending on a number of pulses detectable per symbol time, said adjustment being performed by iteration:
- in a first direction corresponding to either an incrementation or a decrementation of the threshold, until the value of said threshold has attained a first bound;
- in a second direction corresponding to either an incrementation or a decrementation of the threshold, said second direction being different from the first direction, if the value of said threshold has attained said first bound;
- actual detection means delivering the detected pulse information when one of the edges of the envelope of said pulse crosses the adjusted threshold.

10. An ultra wideband receiver of a pulse radio signal, including pulses over each successive symbol time, this receiver comprising at least:
- means for extracting the envelope of said pulses, said extraction means delivering envelope signals;
- detection means comparing said envelope signals with an adjustable threshold value, delivering detected pulses;
- means for calculating and adjusting said threshold value as a function of the number of pulses detected over at least one observation window, said adjustment being performed by iteration:
  - in a first direction corresponding to either an incrementation or a decrementation of the threshold, until the value of said threshold has attained a first bound;
  - in a second direction corresponding to either an incrementation or a decrementation of the threshold, said second direction being different from the first direction, if the value of said threshold has attained said first bound.

11. A computer program stored on a non-transitory computer readable storage medium, comprising a series of instructions, which, during their execution, allow the implementation of the method for adjusting the threshold, as claimed in claim 1.

12. The computer program as claimed in claim 11, characterized in that said program installed in a calculation unit in a device selected from a group consisting of a threshold adjustment device, a pulse detection device, and an ultra wideband receiver.

13. A computer program stored on a non-transitory computer readable storage medium, comprising a series of instructions, which, during their execution, allow the implementation of the method for adjusting the threshold, as claimed in claim 7.

* * * * *